(12) United States Patent
Lloyd-Jones et al.

(10) Patent No.: US 6,229,446 B1
(45) Date of Patent: *May 8, 2001

(54) ALARM APPARATUS

(75) Inventors: David Lloyd-Jones, 56 Blake Lane, Sandiway, Northwich Cheshire CW8 2NP; Roger Vernon Rufus Link, Knutsford, both of (GB)

(73) Assignee: David Lloyd-Jones, Northwich (GB)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/145,625

(22) Filed: Sep. 2, 1998

(51) Int. Cl.[7] ................................................ G08B 23/00
(52) U.S. Cl. ..................... 340/573.1; 340/649; 340/650
(58) Field of Search ............................... 340/573.1, 685, 340/679, 680, 649, 650

(56) References Cited

U.S. PATENT DOCUMENTS

| | | | |
|---|---|---|---|
| 3,699,432 | 10/1972 | Brown . | |
| 3,784,842 | * 1/1974 | Kremer | 340/680 |
| 3,823,342 | 7/1974 | Burr et al. . | |
| 4,558,309 | * 12/1985 | Antonevich | 340/649 |
| 4,710,751 | * 12/1987 | Webster | 340/522 |
| 4,755,805 | * 7/1988 | Chau | 340/662 |
| 5,408,186 | * 4/1995 | Bakhoum | 340/509 |
| 5,469,063 | 11/1995 | Winter . | |
| 5,519,384 | * 5/1996 | Chanudet et al. | 340/649 |
| 5,686,897 | * 11/1997 | Loh | 340/649 |
| 5,754,114 | * 5/1998 | Gnadt | 340/649 |
| 5,909,181 | * 6/1999 | Golzmane | 340/649 |

FOREIGN PATENT DOCUMENTS

0253477A1  1/1988  (EP) .

* cited by examiner

*Primary Examiner*—Jeffery Hofsass
*Assistant Examiner*—Anh La
(74) *Attorney, Agent, or Firm*—Collard & Roe, P.C.

(57) ABSTRACT

The present invention provides an alarm apparatus suitable for use with an object or person, which apparatus is activated upon energisation of the object or person, wherein said alarm apparatus comprises a power source, at least one alarm means, actuating means associated with an unearthed sensor which actuates said alarm means in the event of the energisation of said object or person.

18 Claims, 4 Drawing Sheets

ALARM APPARATUS

BACKGROUND OF THE INVENTION

1. Field of the Invention

The present invention relates to an alarm apparatus. In particular, the present invention relates to an alarm apparatus which, in use, is associated with an object, such as a machine, plant, tool, vehicle or the like, or a person, and is activated in the event that said object or person comes into contact with, or has a dangerous voltage potential induced from an electrical supply network and hence, becomes energised or live with voltages typical of such electrical supply networks.

2. The Prior Art

Persons working in the vicinity of power cables, for example, pylons and underground cables, run the risk of being electrocuted, since the vehicle in which they are located, or the machines or tools with which they are working, which are capable of conducting electricity, may become energised by the discharge of electricity from said power cables. Consequently, any resultant casual contact with such energised vehicles, tools or machines may result in injury or even death.

Accidents of this type sometimes occur in the tree maintenance industry, particularly those persons involved in live power-line tree clearing, i.e. the removal or pruning of trees in the vicinity of power cables which are energised using access platforms.

In order to reduce such associated injuries and fatalities, attempts have been made to insulate said objects or parts of said objects which are likely to be energised by said power cables, for example, mobile access platforms associated with a vehicle utilised for live-line clearing. However, due to the nature of the work, the insulation may become damaged, breached or by-passed thereby exposing parts of the vehicle or machine which are capable of becoming energised to, or close to, ground level.

Therefore, although the insulation described above may reduce the occurrence of such electrocution, the risk of such associated injuries and fatalities are still unacceptably high and represent a hazard to anybody who could come into casual contact with a passively energised object.

With a view to overcoming the above problem, there has been provided alarm apparatus which are adapted to alert any person working in close proximity to power cables or other electricity carrying means that the vehicle in which they are located, or the tool or machine with which they have come into contact, has become energised to a dangerous voltage, i.e. such alarm apparatus warns such persons of the unseen danger of energisation, thereby enabling such person to take all the necessary steps in order to avoid contact with such energised object and hence, observe proximity zone guidelines to safely resolve the hazard by not touching the machinery and not allowing anybody else to do so. An example of an alarm apparatus of this type is disclosed by European Patent Application No. 87304611.4 (Flowmole Corporation).

Generally, and with reference to FIG. 1, known alarm apparatus of this type comprise first and second circuits which are isolated from one another, as well as being antagonistic to one another.

The first circuit comprises a prod 30, a switch means 40 and a conducting wire 50, connected in series. The second circuit comprises a power supply 20, the switch means 40 and alarm means 10, connected in series.

As shown in FIG. 2 a suitable switch means 40 for such an alarm apparatus, developed by us, comprises a ceramic U-shaped clamp 41 which, in use, is attached to the object. Said switch means 40 comprises a bi-metallic strip 42 which acts as a bridge between the conducting wire 50 on one side of the switch means 40 and the prod 30 connected to the other side of the switch means 40. Said switch means 40 also comprises a spring-loaded switch 44 movably located therein.

The bimetallic strip 42 of the switch means 40 is fastened at end 45 by fixing means 43 and is in contact with conducting wire 50 which is attached to a part of the object "X" which is capable of becoming energised. The opposite end 46 of the bi-metallic strip 42 is in contact with the prod 30.

Whilst such known alarm apparatus is inactive, i.e. the object to which it is attached or associated with has not become energised, the first circuit is complete and the end 46 of the bi-metallic strip depresses the spring-loaded switch 44. Consequently, the second circuit is incomplete or broken, i.e. the power source 20 is not connected to the alarm means 10.

On energisation of the object, the resultant flow of electricity to earth causes side 46 of the bi-metallic strip 42 to lift, thereby releasing said spring loaded switch 44. As a result thereof, the second circuit is now complete and the alarm means 10 are activated, that is, as a result of the power source 20 and the alarm means 10 being connected.

When a vehicle (not illustrated), equipped with such an alarm apparatus, comes to a standstill in the vicinity of power cables, the prod 30 is inserted into the ground thereby completing the first circuit.

In the event that the vehicle becomes energised, an electric discharge will surge through the first circuit, i.e. to earth. Depending on the design parameters of the bi-metallic strip 42, if the voltage driving the electric discharge is of sufficient strength, end 46 of the bi-metallic strip 42 will lift or completely burn out, thereby resulting in the release of the spring-loaded switch 44. The subsequent release of the spring-loaded switch 44 results in the completion of the second circuit and hence, the activation of the alarm means 10. Thus in the event of energisation, a person in the vicinity of the vehicle can take all the necessary steps in order to avoid contact with such energised object and hence, observe proximity zone guidelines to safely resolve the hazard.

The problem associated with known alarm apparatus of this type is that in order to work, they are required, in use, to be earthed. Failure to do so will result in the alarm apparatus not being activated such that a person utilising such an alarm apparatus will not be made aware of any pending danger of coming into contact with an object which may have become energised.

SUMMARY OF THE INVENTION

According to the present invention there is provided an alarm apparatus which, in use, is connected to an object or person, and which is activated upon energisation of said object or person, comprising:

- at least one earthed sensor;
- a power source;
- at least one alarm means;
- actuating means associated with said earthed sensor which actuates said alarm means in the event of the energisation of said object or person; characterised in that said alarm apparatus further comprises an unearthed sensor associated with said actuating means which can actuate the alarm means in the event that the earthed sensor is not earthed.

In a further aspect of the present invention there is provided an alarm apparatus which, in use, is connected to an object or person, and which is activated upon energisation of said object or person, comprising:

a power source;

at least one alarm means;

actuating means associated with an unearthed sensor which actuates said alarm means in the event of the energisation of said object or person.

It is an object of the present invention to provide an alarm apparatus which is believed to address the problems associated with the known alarm apparatus outlined above. More particularly, it is an object of the present invention to provide an alarm apparatus which, in use, is associated with an object, such as a machine, plant, tool, vehicle or the like, or a person, and which can activate in the event that same is not earthed properly, or can activate without the need to provide a connection to earth.

BRIEF DESCRIPTION OF THE DRAWINGS

Preferred, non-limiting, embodiments of the present invention will now be described, by way of example, with reference to the accompanying drawings in which.

DETAILED DESCRIPTION OF THE PREFERRED EMBODIMENT

Figure 1:
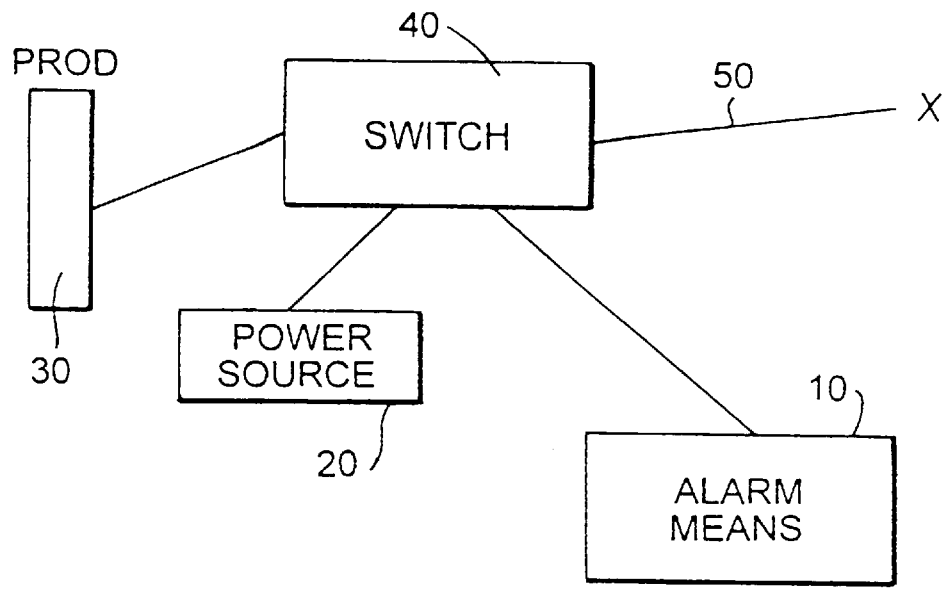
FIG. 1 shows a schematic view of a known alarm apparatus of the prior art.
Figure 2:
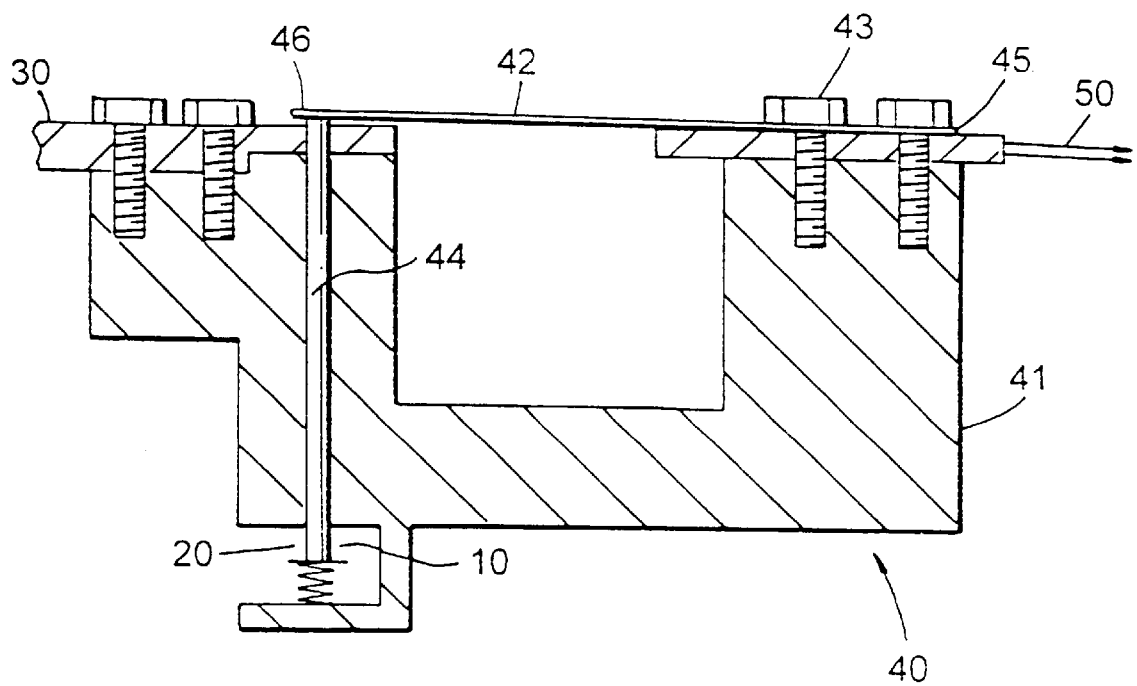
FIG. 2 shows a side cross-sectional view of the prior art alarm apparatus of FIG. 1.
Figure 3:
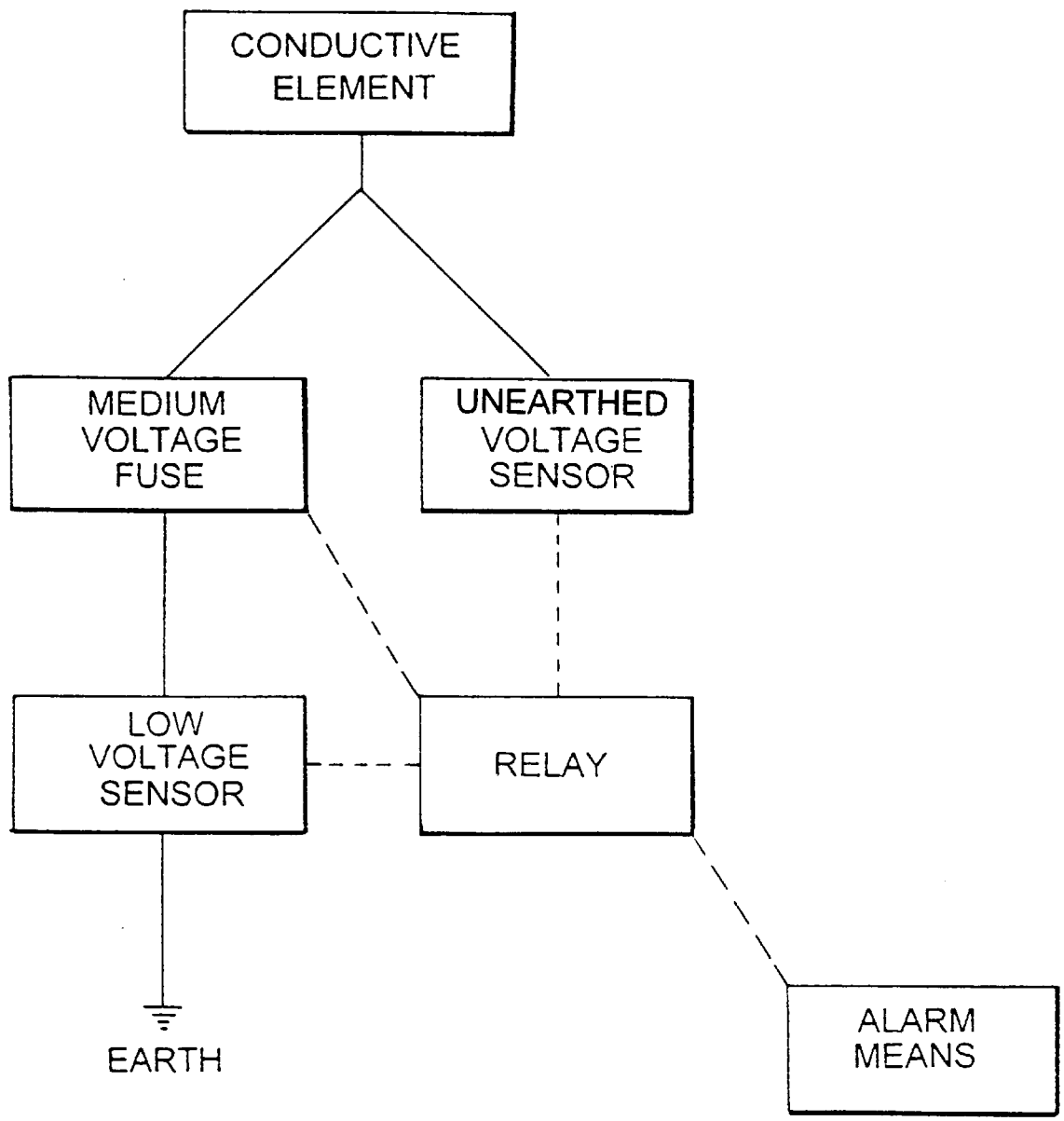
FIG. 3 is schematic diagram of one embodiment of an alarm apparatus in accordance with the present invention.
Figure 4:
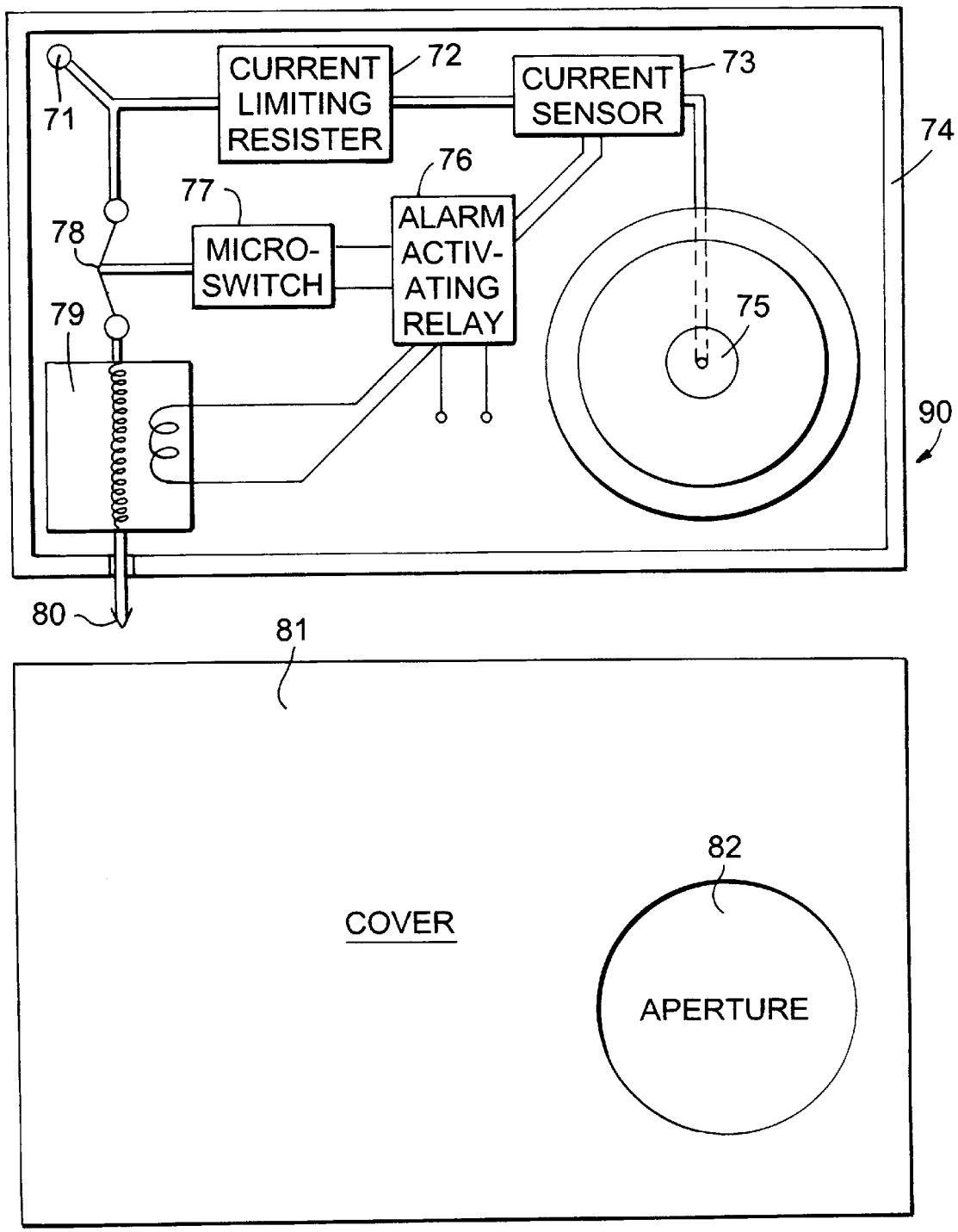
FIG. 4 illustrates an embodiment of an alarm apparatus in accordance with FIG. 3.

As illustrated in FIG. 4, an alarm apparatus in accordance with the present invention comprises a conductive element which is associated with an object or person connected to a low voltage sensor, a medium voltage fuse and an unearthed voltage sensor. Such unearthed voltage sensor, low voltage sensor and medium voltage fuse all being connected to a relay, which in turn is connected to alarm means. As illustrated, the conductive element, medium voltage fuse and low voltage sensor are connectable to earth. An alarm apparatus of the present invention is able to detect different strengths of voltages and, unlike known alarm apparatus, can still actuate in the event that the alarm apparatus is not earthed correctly.

In use, when the alarm apparatus of the present invention and the object with which it is associated comes into contact with, or has a current induced from an electrical supply network and hence, becomes energised, then, and depending on the strength of the voltage detected and the settings of the sensors, the alarm means will be activated. For example, the low voltage sensor will actuate the alarm means via the relay on the detection of a low voltage. The medium voltage fuse, will actuate the alarm means via the relay on the detection of a medium voltage. The skilled person will realise that such medium voltage fuse acts to protect the low voltage sensor circuitry from damage during an energisation event, the strength of which could damage such circuitry. The unearthed voltage sensor will actuate the alarm means via the relay on the detection of an unearthed, potential voltage. Actuation of the alarm apparatus, enables a person to take the necessary action to avoid being electrocuted, i.e. by taking the necessary action to avoid acting as an earth for the voltage source.

With reference to FIG. 4, one embodiment of an alarm apparatus 90 in accordance with the present invention, is housed within an insulating box 74 and is connected to alarm means and power means (not illustrated).

Preferably, the alarm means comprises an audible alarm means, for example, a siren and/or a visual alarm means, for example, a flashing light or a vehicles existing hazard warning mechanism i.e. a vehicles hazard lights. It is to be understood that the alarm apparatus of the present may comprise a plurality of alarm means.

In another unillustrated embodiment of the present invention, the alarm means could be supplemented by a series of light emitting diodes (LEDs). Such LEDs being prominently displayed within or on a vehicle so that same are visible to a person in or within the vicinity of the vehicle. Preferably, there would be four LEDs. The first LED would light up when energisation occurs and would remain on until the alarm is reset, i.e. the first LED would alert a person that an energisation event has occurred. The second LED would light up in the event that energisation caused by a low voltage occurs. The third LED would light up in the event that energisation caused by a medium voltage occurs and the fourth LED would light up in the event that energisation caused by an unearthed voltage occurs. The second, third and fourth LEDs, unlike the first LEDs, will turn off as soon as energisation ceases.

Further preferably, the power source may be independent, however, in the case of a vehicle, the power source may be the same as the vehicle's power supply i.e. the vehicle's battery.

As such alarm means, including the above-mentioned LEDs, and power means are well known, the makings of same will not be further described herein.

Preferably, the insulating box 74 is made of a ceramic or thermo-stable impact resistant plastic. The alarm apparatus 90 is connected through the insulated box 74 at 71 to a conductive element of the object with which it is to be associated, for example, the chassis of a vehicle (not illustrated).

The alarm apparatus 90 further comprises a current limiting resistor 72, a current sensor 73, an ionic discharge spike and protective cup 75, an alarm activating relay 76, an induction coil sensor 79 to sense flows, for instance, between 50/60 HZ 100V–5000V AC and a fuse wire with isolating rod 78 connected to a micro switch 77. The alarm apparatus 90 is connected to earth via a spike or lightning conductor type discharger 80 which is insulated from the chassis of the vehicle. The alarm apparatus 90 is covered by a cover 81 provided with an aperture 82 through which the ionic discharge spike and protective cup 75 are visible.

In use, and when the alarm apparatus 90 is connected to the chassis of a vehicle, the earth connection is effected by inserting prod 80 into the ground. In the event that the vehicle comes into contact with, or has a dangerous voltage induced from an electricity supply network and hence, becomes energised then the alarm will actuate. In this connection, it is submitted that the skilled person will realise that the sensitivity of the induction coil sensor 79 could be tuned to a particular range depending on the electricity supply network with which the vehicle is likely to come into contact. For example, the induction coil sensor could be tuned to a range of 150–800V, protecting the circuit with a fuse set to blow at 500V, although this is subjective to the local electricity supply network where low voltage (LV) transmission would be by single phase 240V or three phase 450V and high voltage (HV) transmission at 9, 11 or 33 KVA (all alternating current AC). Other electricity supply networks operate at different voltages (both LV and HV) all of which could be sensed by the fine tuning of the different sensors to the requirements of that operating environment.

In operation, it is intended that the various sensors or sensing means be active in overlapping sensory ranges and modes, for example, the ionic discharge spike could provide sensing means, at least for HV discharges, if the connection to earth through the fuse and induction coil is not made effectively. In this connection, it will be realised by the skilled person that the alarm apparatus of the present invention will activate in the event that the earth connection is not effected properly. That is, it is to be understood that the sensitivity of the ionic discharge spike could be tuned to provide back up to the low voltage induction coil sensor to adequately ensure against failure of the alarm due to poor earthing.

Additionally, and in light of the above, it is also to be understood that the alarm apparatus of the present invention, in use, and unlike known alarm apparatus, does not require to be connected to earth, that is, by tuning the sensitivity of the ionic discharge spike in light of the requirements of the operating environment, the earthing circuitry can be dispensed with. That is, and with reference to FIG. 5, an alarm apparatus in accordance with a further aspect of the present invention can be provided which does not require prod 80, induction coil sensor 79 and the fuse wire with isolating rod 78 connected to switch 77. Such an alarm apparatus thus being provided with sensing means which senses the potential above earth of a surface to which it is attached and hence, dispenses with the need for a connection to earth, to allow the alarm means to be activated.

Figure 5:
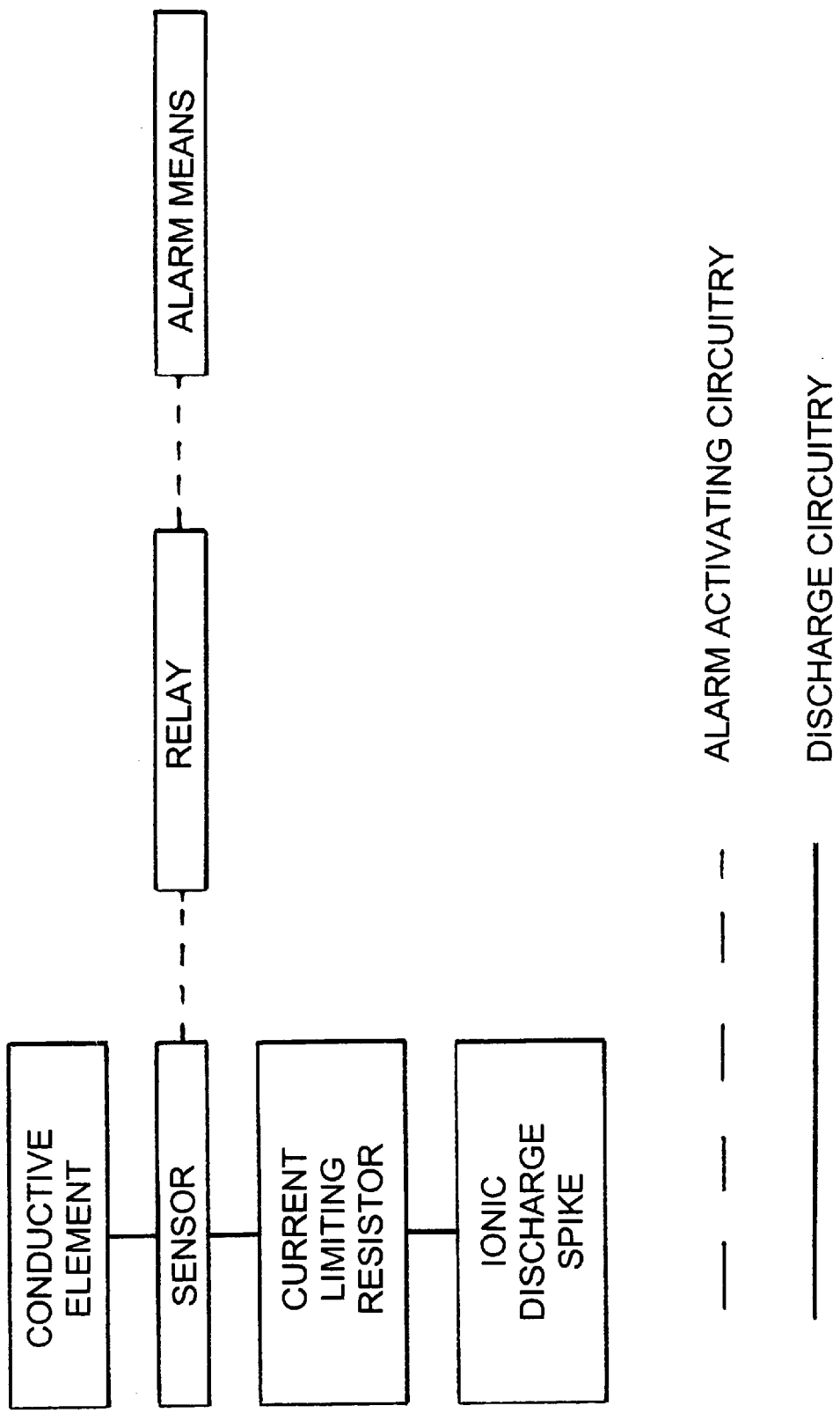
FIG. 5 is a schematic diagram of an alarm apparatus in accordance with a further aspect of the present invention.

As illustrated in FIG. 5, an alarm apparatus in accordance with a further aspect of the present invention comprises a conductive element, a sensor, a current limiting resistor and an ionic discharge spike in series, such that, and depending on the sensitivity of the sensor, when the potential or the conductive element rises to a potential above earth which is believed to be dangerous, the sensor via relay means will actuate the alarm means, that is, by completing the circuit between a known power source and the alarm means.

Although the present invention has been described in relation to an alarm apparatus which is associated with a vehicle and is capable of detecting the energisation of said vehicle, it is to be understood that the alarm apparatus of the present invention can be adapted for use with any other object, such as a machine or tool, or person, which may become energised. Furthermore, and while certain preferred embodiments of the present invention have been disclosed in detail, it is to be understood that various modifications may be adopted without departing from the spirit of the invention, or the scope of the following claims.

We claim:

1. An alarm apparatus which, in use, is connectable to an object, and which is activated when said object is energised by contact or inductance to a voltage of an electricity supply network that would injure a person when said person acts as an earth for said object, comprising:

at least one earthed sensor that detects voltages typical of an electricity supply network;

power source;

at least one alarm means;

actuating means associated with said earthed sensor which actuates said alarm means in the event of the energisation of said object; characterized in that said alarm apparatus further comprises an unearthed sensor that detects voltages typical of an electricity supply network and which is associated with said actuating means and can actuate the alarm means even when the earthed sensor is not earthed.

2. An alarm apparatus as claimed in claim 1, wherein said alarm means are audible and/or visual alarm means.

3. An alarm apparatus as claimed in claim 2, wherein said audible alarm means comprise a siren.

4. An alarm apparatus as claimed in claim 2, wherein said visual alarm means comprise at least one flashing light.

5. An alarm apparatus as claimed in claim 1, wherein the actuating means comprises relay means which are capable of actuating different alarm means depending on the longevity of the energisation event.

6. An alarm apparatus as claimed in claim 1, wherein said sensors are capable of sensing different strengths of voltage.

7. An alarm apparatus as claimed in claim 1, wherein said sensors have overlapping ranges of sensing.

8. An alarm apparatus as claimed in claim 1, wherein said power source is independent of the power source of the object.

9. An alarm apparatus as claimed in claim 1, wherein said power is the same as the power source of the object.

10. An alarm apparatus which, in use, is connectable to an object, and which is activated when said object is energised, by contact or inductance, to a voltage of an electricity supply network that would injure said person when said person acts as an earth for said object, comprising:

a power source;

at least one alarm means;

actuating means associated with an unearthed sensor, which in use detects voltages typical of an electricity supply network and which actuates said alarm means in the event of the energisation of said object.

11. An alarm apparatus as claimed in claim 10, wherein said alarm means are audible and/or visual alarm means.

12. An alarm apparatus as claimed in claim 11, wherein said audible alarm means comprise a siren.

13. An alarm apparatus as claimed in claim 11, wherein said visual alarm means comprise at least one flashing light.

14. An alarm apparatus as claimed in claim 10, wherein the actuating means comprises relay means which are capable of actuating different alarm means depending on the longevity of the energisation event.

15. An alarm apparatus as claimed in claim 10, wherein said sensor is capable of sensing different strengths of voltage.

16. An alarm apparatus as claimed in claim 10, wherein said sensor has overlapping ranges of sensing.

17. An alarm apparatus as claimed in claim 10, wherein said power source is independent of the power source of said object.

18. An alarm apparatus as claimed in claim 10, wherein said power is the same as the power source of said object.

* * * * *